US012776372B2

(12) United States Patent
Disegni et al.

(10) Patent No.: US 12,776,372 B2
(45) Date of Patent: Oct. 27, 2026

(54) ROW DECODER CIRCUIT AND CORRESPONDING METHOD OF OPERATION

(71) Applicant: STMicroelectronics International N.V., Geneva (CH)

(72) Inventors: Fabio Enrico Carlo Disegni, Spino d'adda (IT); Cesare Torti, Pavia (IT); Davide Manfré, Pandino (IT); Massimo Caruso, Messina (IT); Maurizio Francesco Perroni, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 86 days.

(21) Appl. No.: 18/883,201

(22) Filed: Sep. 12, 2024

(65) Prior Publication Data

US 2025/0111878 A1 Apr. 3, 2025

(30) Foreign Application Priority Data

Oct. 3, 2023 (IT) ........................ 102023000020436

(51) Int. Cl.
*G11C 16/08* (2006.01)
*G11C 16/10* (2006.01)
*G11C 16/28* (2006.01)

(52) U.S. Cl.
CPC ............ *G11C 16/08* (2013.01); *G11C 16/102* (2013.01); *G11C 16/28* (2013.01)

(58) Field of Classification Search
CPC ...................................................... G11C 16/08
USPC ..................................................... 365/230.06
See application file for complete search history.

(56) References Cited

U.S. PATENT DOCUMENTS

| | | | | |
|---|---|---|---|---|
| 6,885,250 | B1 | 4/2005 | Le et al. | |
| 7,079,417 | B2 | 7/2006 | Nam | |
| 7,391,670 | B2 * | 6/2008 | Lee | G11C 7/1078 365/194 |
| 7,969,810 | B2 * | 6/2011 | Keeth | G11C 5/063 365/230.06 |
| 11,289,158 | B2 | 3/2022 | Disegni et al. | |

(Continued)

OTHER PUBLICATIONS

STMicroelectronics International N.V., "Rapporto Di Ricerca", Ministero delle Imprese e del Made in Italy, IT 202300020436, Mar. 13, 2024, 7 pages.

*Primary Examiner* — Muna A Techane
(74) *Attorney, Agent, or Firm* — Slater Matsil, LLP

(57) ABSTRACT

A row decoder circuit includes an input node receiving a row selection signal and an output node coupled to a memory device word line. A pull-down circuit couples the word line to ground in response to the row selection signal being asserted. A pull-up circuit couples the word line to a supply node in response to a deselection signal being de-asserted. An inverter circuit receives as input a control signal from a control node and produces the deselection signal. A current generator sources a biasing current to the control node. A further pull-down circuit couples the control node to ground in response to the row selection signal being asserted, and comprises a first cascode n-channel transistor, a cascode p-channel transistor, a second cascode n-channel transistor, and at least one selection transistor controlled by the row selection signal, all having their conductive channels arranged in series.

20 Claims, 2 Drawing Sheets

(56) References Cited

U.S. PATENT DOCUMENTS

| | | | | |
|---|---|---|---|---|
| 2011/0063893 | A1* | 3/2011 | Behera | G11C 11/412 365/189.011 |
| 2014/0269140 | A1 | 9/2014 | Sanjeevarao et al. | |
| 2016/0240260 | A1 | 8/2016 | Tran et al. | |
| 2016/0365147 | A1 | 12/2016 | Georgescu et al. | |
| 2017/0330624 | A1 | 11/2017 | Lim | |
| 2021/0183442 | A1* | 6/2021 | Disegni | G11C 13/0028 |
| 2023/0062498 | A1 | 3/2023 | Vimercati | |
| 2023/0207013 | A1 | 6/2023 | Sung | |
| 2024/0096412 | A1 | 3/2024 | Conte | |
| 2024/0162899 | A1 | 5/2024 | Mertens | |
| 2025/0111878 | A1 | 4/2025 | Disegni et al. | |

* cited by examiner

ROW DECODER CIRCUIT AND CORRESPONDING METHOD OF OPERATION

CROSS-REFERENCE TO RELATED APPLICATIONS

This application claims the benefit of Italian Patent Application No. 102023000020436, filed on Oct. 3, 2023, which application is hereby incorporated herein by reference.

TECHNICAL FIELD

The description relates to row decoder circuits and corresponding methods of operation.

Row decoders may be applied to non-volatile memories (NVM) where the state of a memory cell can be changed by applying a programming current to the cell itself, such as phase-change memories (PCM), spin-torque magnetoresistive random-access memories (ST-MRAM), and resistive random-access memories (RRAM).

BACKGROUND

Document U.S. Pat. No. 11,289,158 B2, assigned to companies of the STMicroelectronics group, discloses a non-volatile memory device that includes a row decoder. The row decoder includes a pull-down stage (e.g., operating as a NAND gate) and a pull-up stage (e.g., a p-channel transistor) for each word line of the memory. The pull-down stage is configured to tie the word line to ground (i.e., to select the word line) and the pull-up stage is configured to tie the word line to a selectable supply voltage (e.g., the supply voltage being 2 V during read operation and 4.8 V during write operation). The row decoder further includes a CMOS inverter configured to drive the pull-up stage. The CMOS inverter is supplied between the supply voltage and a selectable shifted ground voltage (e.g., the shifted ground voltage being 0 V during read operation and 2.4 V during write operation). The input node of the CMOS inverter is biased by a current generator (e.g., a current mirror) and can be tied to ground via one or more selection transistors coupled in series with two cascode n-channel transistors. During read operation, the input node of the CMOS inverter switches between 0 V (selected word line) and 1.8 V (unselected word line). During write operation, the input node of the CMOS inverter switches between 0 V (selected word line) and 4.8 V (unselected word line). Therefore, transistors in the CMOS inverter and in the current generator are dimensioned for 5 V rating.

Other documents possibly of interest include US 2014/0269140 A1, US 2023/0062498 A1, US 2016/0240260 A1, and U.S. Pat. No. 6,885,250 B1.

In such known memory applications, the voltage domain of the row decoder circuit may be between ground voltage (e.g., 0 V) and a relatively high voltage (e.g., 4.8 V or 5 V, the higher value of the selectable supply voltage), and the transistors are conventionally designed (e.g., sized) for such a voltage rating. Such sizing implies thick gate oxide and/or large area occupation, and the fabrication of such high-voltage transistors also requires dedicated manufacturing steps and dedicated masks that increase the manufacturing costs.

Therefore, there is a need in the art to provide improved row decoder circuits that do not rely on high-voltage rating transistors.

SUMMARY

An object of one or more embodiments is to contribute in providing such improved row decoder circuits that can handle high voltages (e.g., in the range of 0 V to about 5 V) without implementing high-voltage rating transistors, but implementing (only) low-voltage rating transistors (e.g., in the range of 0 V to about 2.5 V).

According to one or more embodiments, such an object can be achieved by a row decoder circuit having the features set forth in the claims that follow.

One or more embodiments may relate to a corresponding method of operation.

The claims are an integral part of the technical teaching provided herein in respect of the embodiments.

According to an aspect of the present description, a row decoder circuit includes at least one input node configured to receive at least one row selection signal and an output node configured for coupling to a word line of a memory device. The row decoder includes a pull-down circuit coupled between the word line and a ground node at ground voltage. The pull-down circuit is configured to selectively couple the word line to the ground node in response to the at least one row selection signal being asserted. The row decoder includes a pull-up circuit coupled between the word line and a supply node that provides a selectable supply voltage. The pull-up circuit is configured to selectively couple the word line to the supply node in response to a deselection signal being de-asserted. The row decoder includes an inverter circuit supplied between the supply node and a shifted ground node that provides a selectable reference voltage. The inverter circuit is configured to receive as input a control signal from a control node and produce the deselection signal. The row decoder includes a current generator circuit configured to source a biasing current to the control node. The row decoder includes a further pull-down circuit coupled between the control node and the ground node. The further pull-down circuit is configured to selectively couple the control node to the ground node in response to the at least one row selection signal being asserted. The further pull-down circuit includes a first cascode n-channel transistor, a cascode p-channel transistor, a second cascode n-channel transistor, and at least one selection transistor having their conductive channels arranged in series between the control node and the ground node. The at least one selection transistor is controlled by the at least one row selection signal.

One or more embodiments may thus provide a row decoder circuit able to manage high voltages (e.g., in the range of 0 V to 5 V) without resorting to high-voltage rating devices but using (only) low-voltage rating devices (e.g., in the range of 0 V to 2.5 V).

According to another aspect of the present description, a method of operating a row decoder circuit according to one or more embodiments includes receiving at least one row selection signal at at least one input node of the row decoder, selectively coupling a word line to a ground node of the row decoder in response to the at least one row selection signal being asserted, selectively coupling the word line to a supply node of the row decoder in response to a deselection signal being de-asserted, receiving, at an input of an inverter circuit of the row decoder, a control signal from a control node of the row decoder and producing, at an output of the inverter circuit, the deselection signal, sourcing a biasing current to the control node; and selectively coupling the control node to the ground node in response to the at least one row selection signal being asserted.

BRIEF DESCRIPTION OF THE DRAWINGS

One or more embodiments will now be described, by way of example, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

By way of introduction to the detailed description of exemplary embodiments, reference may be made to FIGS. 1 and 2, discussed in the following.

Figure 1:
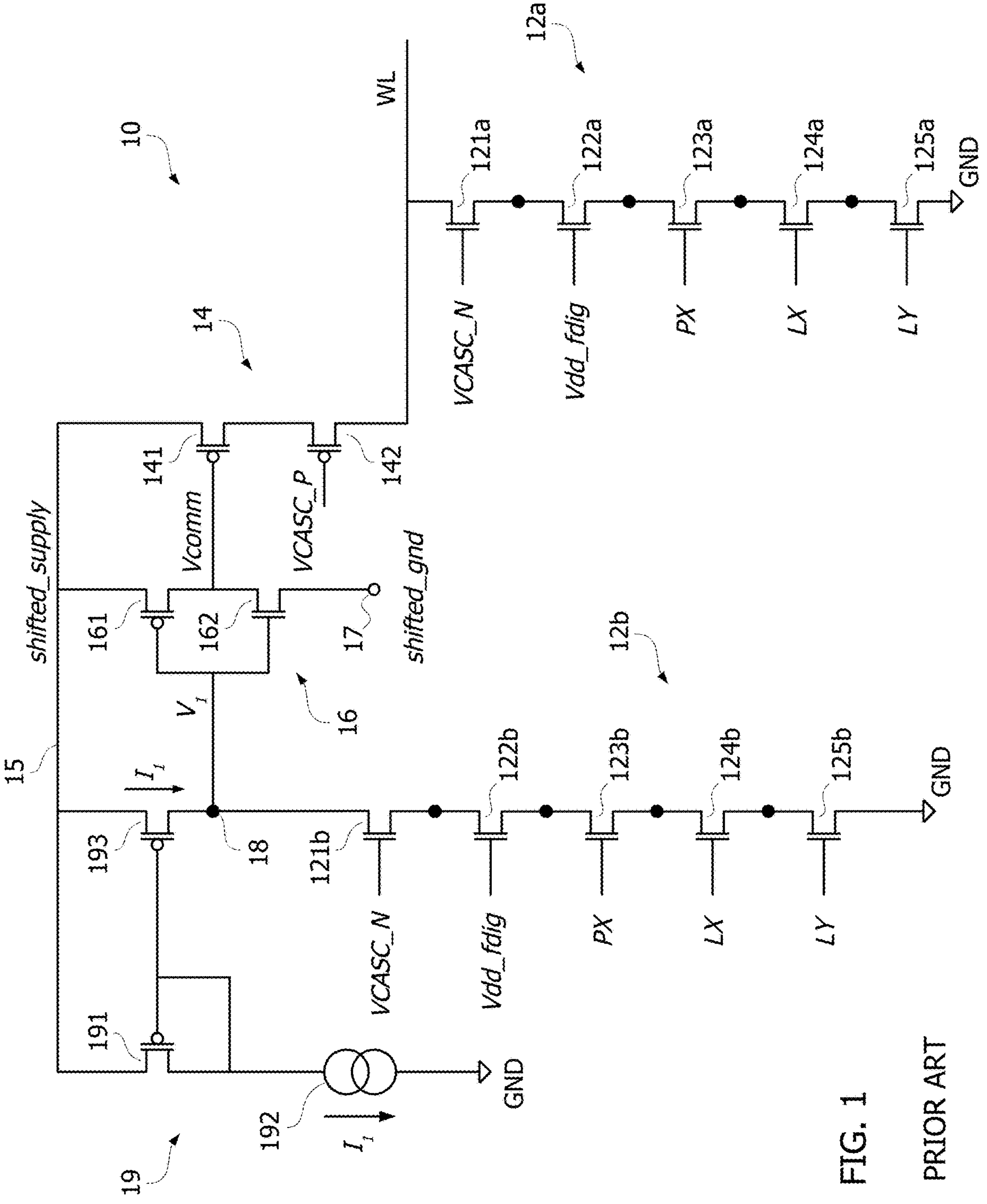
FIG. 1 PRIOR ART
FIG. 1 is a circuit block diagram exemplary of a row decoder circuit.

FIG. 1 is a circuit block diagram exemplary of a row decoder circuit 10 as is known, for instance, from document U.S. Pat. No. 11,289,158 B2 cited in the foregoing. The row decoder circuit 10 is configured to control (i.e., select and deselect) a word line WL of a memory device. To this effect, the row decoder 10 includes a pull-down stage **12*a* and a pull-up stage 14 for each word line WL of the memory. The pull-down stage 12*a* is configured to tie the word line WL to ground GND (i.e., to select the word line) and the pull-up stage 14 is configured to tie the word line WL to a supply node 15** that provides a selectable (or variable) supply voltage shifted_supply (i.e., to deselect the word line). The supply voltage shifted_supply may be, for instance, 2 V during read operation and 4.8 V during write operation.

The pull-down stage **12*a* may include five n-channel MOS transistors arranged in series between the word line WL and ground GND, and specifically, starting from the word line WL and moving towards ground GND: a first cascode transistor 121*a*, a second cascode transistor 122*a*, a first selection transistor 123*a*, a second selection transistor 124*a*, and a third selection transistor 125*a*. Transistor 121*a* has a drain terminal coupled to the word line WL, a gate terminal configured to receive a first (positive) cascode voltage VCASC_N, and a source terminal coupled to the drain terminal of transistor 122*a*. Transistor 122*a* has a drain terminal coupled to the source terminal of transistor 121*a*, a gate terminal configured to receive a second (positive) cascode voltage Vdd_fdig, and a source terminal coupled to the drain terminal of transistor 123*a*. Transistor 123*a* has a drain terminal coupled to the source terminal of transistor 122*a*, a gate terminal configured to receive a first selection signal PX, and a source terminal coupled to the drain terminal of transistor 124*a*. Transistor 124*a* has a drain terminal coupled to the source terminal of transistor 123*a*, a gate terminal configured to receive a second selection signal LX, and a source terminal coupled to the drain terminal of transistor 125*a*. Transistor 125*a* has a drain terminal coupled to the source terminal of transistor 124*a***, a gate terminal configured to receive a third selection signal LY, and a source terminal coupled to ground GND.

The pull-up stage 14 may include two p-channel MOS transistors arranged in series between the supply node 15 and the word line WL, and specifically, starting from the supply node 15 and moving towards the word line WL: a deselection transistor 141, and a cascode transistor 142. Transistor 141 has a source terminal coupled to the supply node 15, a gate terminal configured to receive a deselection signal Vcomm, and a drain terminal coupled to the source terminal of transistor 142. Transistor 142 has a source terminal coupled to the drain terminal of transistor 141, a gate terminal configured to receive a cascode voltage VCASC_P, and a drain terminal coupled to the word line WL.

The row decoder 10 further includes a CMOS inverter 16 configured to produce signal Vcomm to drive transistor 141. The CMOS inverter 16 is supplied between node 15 (at voltage shifted_supply) and a shifted ground node 17 that provides a selectable (or variable) shifted ground voltage shifted_gnd. The shifted ground voltage shifted_gnd may be, for instance, 0 V during read operation and 2.4 V during write operation (i.e., equal to the reference voltage of ground GND during read operation, and equal to half of the supply voltage shifted_supply during write operation). In particular, inverter 16 may include a p-channel MOS transistor 161 and an n-channel MOS transistor 162 arranged in series between nodes 15 and 17. Transistor 161 has a source terminal coupled to the supply node 15, a gate terminal coupled to a deselection control node 18, and a drain terminal coupled to the drain terminal of transistor 162 and to the gate terminal of transistor 141. Transistor 162 has a drain terminal coupled to the drain terminal of transistor 161 and to the gate terminal of transistor 141, a gate terminal coupled to node 18, and a source terminal coupled to the shifted ground node 17.

The deselection control node 18 (i.e., the input of the CMOS inverter 16) is biased by a current generator 19 (e.g., a current mirror) that sources a current $I_1$ to it. For instance, the current mirror 19 may include a first branch including a diode-connected p-channel MOS transistor 191 arranged in series with a current-sinking element 192 between the supply node 15 and ground GND, and a second branch including a mirroring p-channel MOS transistor 193 arranged between the supply node 15 and the control node 18 and having a gate terminal coupled to the gate terminal of transistor 191 to source current $I_1$ to node 18. The mirroring ratio of transistors 191 and 193 may be unitary.

The deselection control node 18 can be tied to ground GND via a pull-down stage **12*b* that replicates the structure and operation of the pull-down stage 12*a*. In particular, the pull-down stage 12*b* includes two cascode n-channel transistors 121***b*, 122*b* coupled in series with a plurality of (e.g., three) selection transistors 123*b*, 124*b*, 125*b* that receive the same signals VCASC_N, Vdd_fdig, PX, LX, LY as the pull-down stage 12*a*.

Therefore, a switching control voltage $V_1$ is produced at node 18 by the operation of the generator 19 and the pull-down stage 12*b*.

Figure 2:
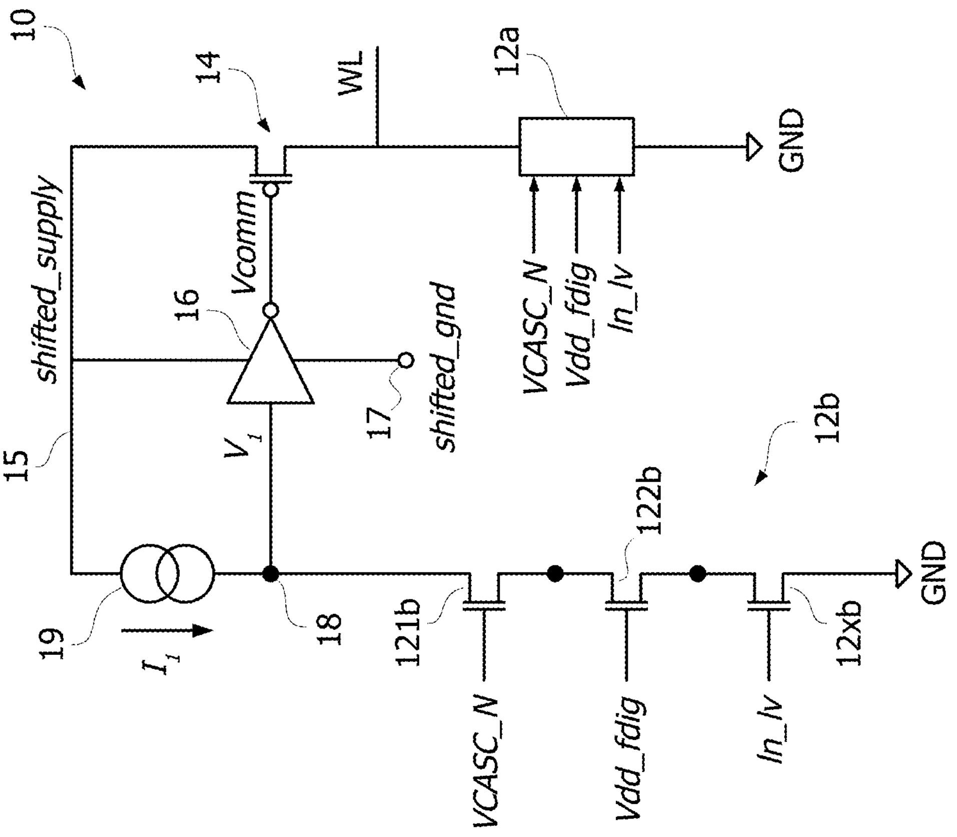
FIG. 2 PRIOR ART
FIG. 2 is a simplified circuit block diagram exemplary of the row decoder circuit of FIG. 1.

FIG. 2 shows the same architecture of FIG. 1 in a simplified view, where the internal structure of the pull-down stage 12*a*, the pull-up stage 14, the CMOS inverter 16 and the current generator 19 is not shown in detail. Further, concerning the pull-down stage 12*b*, the selection transistors 123*b*, 124*b* and 125*b* are shown as a single transistor 12*xb* and the reference ln_lv is used to indicate collectively the selection signals PX, LX, LY.

During read operation, voltage $V_1$ at node 18 switches between 0 V (in case the word line WL is selected) and 1.8 V (in case the word line WL is deselected). During write operation, voltage $V_1$ at node 18 switches between 0 V (in case the word line WL is selected) and 4.8 V (in case the word line WL is deselected). Therefore, transistors 161, 162 and 193 are subject to a 5 V (or 4.8 V) voltage swing, and are dimensioned accordingly (e.g., for 5 V rating). Such sizing may imply thick gate oxide and/or large area occupation, and the fabrication of such high-voltage transistors may also require dedicated manufacturing steps and dedicated masks that increase the manufacturing costs.

Therefore, one or more embodiments relate to an improved row decoder circuit that does not rely on high-voltage rating transistors.

Figure 3:
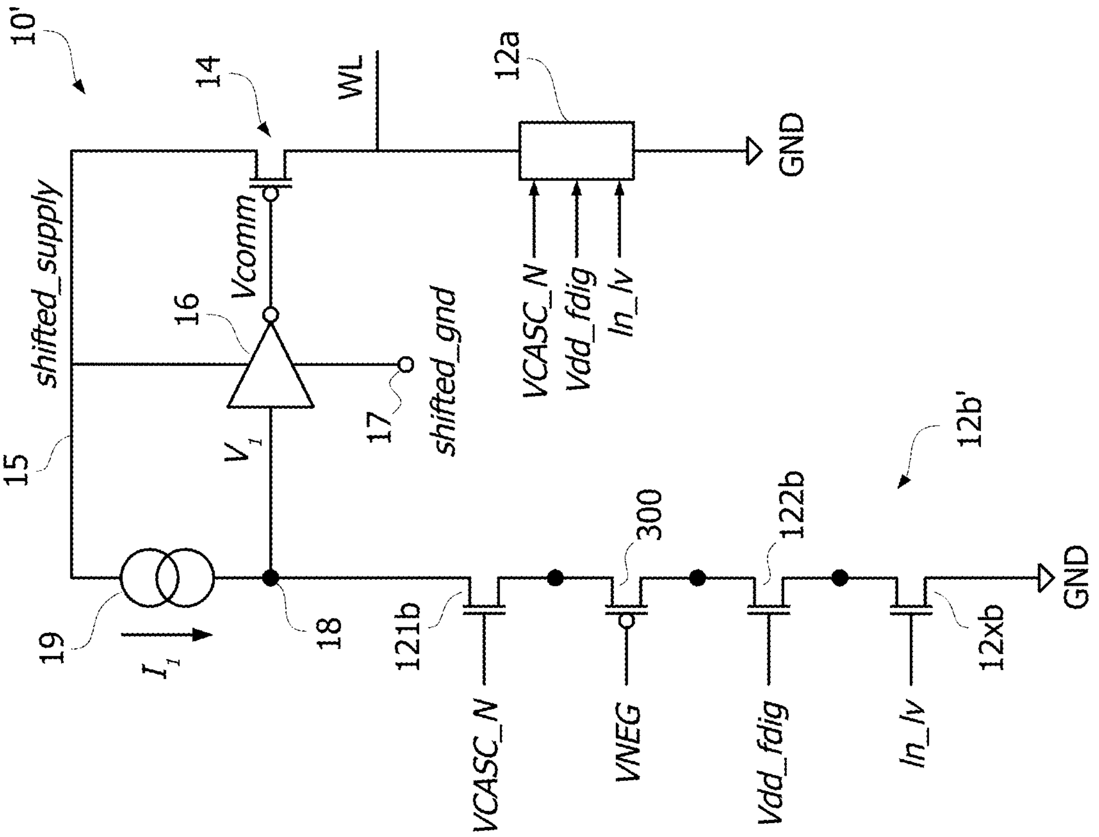
FIG. 3 is a circuit block diagram exemplary of a row decoder circuit according to one or more embodiments of the present description.

In detail, FIG. 3 is a circuit block diagram exemplary of a row decoder circuit 10' according to one or more embodiments. As exemplified in FIG. 3, the row decoder 10' includes substantially all the circuit components described with reference to the decoder architecture of FIGS. 1 and 2, plus an additional p-channel MOS cascode transistor 300 arranged in series with the cascode transistors 121*b* and 122*b* in the pull-down stage 12*b*' (i.e., between node 18 and ground GND). Transistor 300 is configured to receive, at its gate terminal, a cascode voltage VNEG.

In particular, in one or more embodiments the cascode transistor 300 may be arranged between transistors 121*b* and 122*b*. In detail, transistor 300 has a source terminal coupled to the source terminal of transistor 121*b*, a drain terminal coupled to the drain terminal of transistor 122*b*, and a gate terminal configured to receive the cascode voltage VNEG.

The cascode voltage VNEG may be produced by a control circuit of the memory device. In one or more embodiments, the cascode voltage VNEG may be, for instance, 0 V minus a threshold Vth during read operation (i.e., the ground voltage GND minus the threshold Vth) and 2.4 V minus the threshold Vth during write operation (i.e., half of the supply voltage shifted_supply minus the threshold Vth). For instance, the threshold Vth (the voltage threshold of transistor 300) may be equal to 0.4 V. In this example, the cascode voltage VNEG is equal to minus 0.4 V during read operation and equal to 2.0 V during write operation. Therefore, at least during read operation, the cascode voltage VNEG is negative.

Therefore, in the architecture of FIG. 3, the voltages may assume the following exemplary values, depending on whether the memory operates in read mode or write mode, and depending on whether the word line WL has to be selected or deselected. During read operation, to select the word line WL, the selection signals ln_lv (e.g., PX, LX, PY) are logic high (e.g., 1 V), the cascode voltage VNEG is negative (e.g., −0.4 V), the supply voltage shifted_supply is 2 V, and the ground voltage shifted_gnd is 0 V; consequently, voltage $V_1$ at node 18 is 0 V, voltage Vcomm is 2 V, and the word line WL is pulled down to ground GND (0 V). During read operation, to deselect the word line WL, the selection signals ln_lv (e.g., PX, LX, PY) are logic low (e.g., 0 V), the cascode voltage VNEG is negative (e.g., −0.4 V), the supply voltage shifted_supply is 2 V, and the ground voltage shifted_gnd is 0 V; consequently, voltage $V_1$ at node 18 is 2 V, voltage Vcomm is 0 V, and the word line WL is pulled up to the supply voltage shifted_supply (2 V). During write operation, to select the word line WL, the selection signals ln_lv (e.g., PX, LX, PY) are logic high (e.g., 1 V), the cascode voltage VNEG is positive (e.g., 2 V), the supply voltage shifted_supply is 4.8 V, and the ground voltage shifted_gnd is 2.4 V; consequently, voltage $V_1$ at node 18 is 2.4 V, voltage Vcomm is 4.8 V, and the word line WL is pulled down to ground GND (0 V). During write operation, to deselect the word line WL, the selection signals ln_lv (e.g., PX, LX, PY) are logic low (e.g., 0 V), the cascode voltage VNEG is positive (e.g., 2 V), the supply voltage shifted_supply is 4.8 V, and the ground voltage shifted_gnd is 2.4 V; consequently, voltage $V_1$ at node 18 is 4.8 V, voltage Vcomm is 2.4 V, and the word line WL is pulled up to the supply voltage shifted_supply (4.8 V).

Therefore, in the architecture of FIG. 3, voltage $V_1$ at node 18 switches between 0 V (in case the word line WL is selected) and 1.8 V (in case the word line WL is deselected) during read operation, and it switches between 2.4 V (in case the word line WL is selected) and 4.8 V (in case the word line WL is deselected) during write operation. Therefore, the voltage swing of node 18 is limited to less than 2.5 V. As a result, transistors 161, 162 and 193 are subject to a maximum voltage swing of 2.5 V, and are dimensioned accordingly (e.g., for 2.5 V rating). Such sizing implies a thinner gate oxide, a lower area occupation and/or a higher switching speed compared to previous solutions. Further, the fabrication of low-voltage transistors implies less manufacturing steps and less masks compared to previous solutions, which result in lower manufacturing costs.

As anticipated, row decoder circuits as disclosed herein may be used in the control circuits of a memory.

One or more embodiments as exemplified herein may thus be advantageous insofar as they facilitate managing "high" voltages (e.g., in the range of 0 V to 5 V) without resorting to high-voltage rating devices but using (only) low-voltage rating devices (e.g., in the range of 0 V to 2.5 V).

Without prejudice to the underlying principles, the details and embodiments may vary, even significantly, with respect to what has been described by way of example, without departing from the extent of protection.

The extent of protection is determined by the annexed claims.

The invention claimed is:

1. A row decoder circuit, comprising:

at least one input node configured to receive at least one row selection signal and an output node configured for coupling to a word line of a memory device;

a first pull-down circuit coupled between the word line and a ground node at ground voltage, the first pull-down circuit configured to selectively couple the word line to the ground node in response to the at least one row selection signal being asserted;

a pull-up circuit coupled between the word line and a supply node that provides a selectable supply voltage, the pull-up circuit configured to selectively couple the word line to the supply node in response to a deselection signal being de-asserted;

an inverter circuit coupled between the supply node and a shifted ground node that provides a selectable reference voltage, the inverter circuit configured to receive as input a control signal from a control node and produce the deselection signal;

a current generator circuit configured to source a biasing current to the control node; and a second pull-down circuit coupled between the control node and the ground node, the second pull-down circuit configured to selectively couple the control node to the ground node in response to the at least one row selection signal being asserted, wherein the second pull-down circuit comprises a first cascode n-channel transistor, a cascode p-channel transistor, a second cascode n-channel transistor, and at least one selection transistor all having conductive channels arranged in series between the control node and the ground node, and wherein the at least one selection transistor is controlled by the at least one row selection signal.

2. The row decoder circuit according to claim 1, wherein:

the first cascode n-channel transistor has a conductive channel arranged between the control node and a first cascode node;

the cascode p-channel transistor has a conductive channel arranged between the first cascode node and a second cascode node;

the second cascode n-channel transistor has a conductive channel arranged between the second cascode node and a third cascode node; and the at least one selection transistor has a conductive channel arranged between the third cascode node and the ground node.

3. The row decoder circuit according to claim 1, wherein the cascode p-channel transistor has a control terminal configured to receive a cascode control voltage, and wherein the row decoder circuit comprises a memory control circuit configured to set the cascode control voltage to a negative value during a read operation of the memory device.

4. The row decoder circuit according to claim 3, wherein the negative value of the cascode control voltage is equal to ground voltage minus a threshold voltage.

5. The row decoder circuit according to claim 4, wherein the threshold voltage is in a range of 0.3 V to 0.5 V.

6. The row decoder circuit according to claim 5, wherein the threshold voltage is equal to 0.4 V.

7. The row decoder circuit according to claim 1, wherein the cascode p-channel transistor has a control terminal configured to receive a cascode control voltage, and wherein the row decoder circuit comprises a memory control circuit configured to set the cascode control voltage to a positive value during a write operation of the memory device.

8. The row decoder circuit according to claim 7, wherein the positive value of the cascode control voltage is equal to half of the selectable supply voltage minus a threshold voltage.

9. The row decoder circuit according to claim 8, wherein the threshold voltage is in a range of 0.3 V to 0.5 V.

10. The row decoder circuit according to claim 9, wherein the threshold voltage is equal to 0.4 V.

11. The row decoder circuit according to claim 1, further comprising a memory control circuit configured to:

during a read operation of the memory device, set the selectable supply voltage to a first supply value and set the selectable reference voltage to the ground voltage; and during a write operation of the memory device, set the selectable supply voltage to a second supply value that is higher than the first supply value, and set the selectable reference voltage to half of the second supply value.

12. The row decoder circuit according to claim 11, wherein the first supply value is equal to 2 V and the second supply value is equal to 4.8 V.

13. A method of operating a row decoder circuit comprising at least one input node, an output node for a word line of a memory device, a first pull-down circuit coupled between the word line and a ground node at ground voltage, a pull-up circuit coupled between the word line and a supply node, an inverter circuit coupled between the supply node and a shifted ground node, and a second pull-down circuit coupled between a control node and the ground node, the second pull-down circuit comprising a first cascode n-channel transistor, a cascode p-channel transistor, a second cascode n-channel transistor, and at least one selection transistor all having conductive channels arranged in series between the control node and the ground node, the method comprising:

receiving, by the at least one input node, at least one row selection signal;

selectively coupling, by the first pull-down circuit, the word line to the ground node in response to the at least one row selection signal being asserted;

selectively coupling, by the pull-up circuit, the word line to the supply node in response to a deselection signal being de-asserted;

receiving, at an input of the inverter circuit, a control signal from the control node;

producing, at an output of the inverter circuit, the deselection signal;

sourcing, by a current generator, a biasing current to the control node;

selectively coupling, by the second pull-down circuit, the control node to the ground node in response to the at least one row selection signal being asserted, the selectively coupling the control node to the ground node comprising controlling, by the at least one row selection signal, the at least one selection transistor; and setting, by a memory control circuit, a cascode control voltage to a negative value during a read operation of the memory device, and receiving, by a control terminal of the cascode p-channel transistor, the cascode control voltage; or setting, by the memory control circuit, the cascode control voltage to a positive value during a write operation of the memory device, and receiving, by the control terminal of the cascode p-channel transistor, the cascode control voltage.

14. The method according to claim 13, further comprising:

providing, by the supply node, a selectable supply voltage; and providing, by the shifted ground node, a selectable reference voltage.

15. The method according to claim 14, further comprising, by the memory control circuit:

during the read operation of the memory device, setting the selectable supply voltage to a first supply value and setting the selectable reference voltage to the ground voltage; and during the write operation of the memory device, setting the selectable supply voltage to a second supply value that is higher than the first supply value, and setting the selectable reference voltage to half of the second supply value.

16. A row decoder circuit, comprising:

at least one input node configured to receive at least one row selection signal and an output node configured for coupling to a word line of a memory device;

a first pull-down circuit coupled between the word line and a ground node at ground voltage, the first pull-down circuit configured to selectively couple the word line to the ground node in response to the at least one row selection signal being asserted;

a pull-up circuit coupled between the word line and a supply node that provides a selectable supply voltage, the pull-up circuit configured to selectively couple the word line to the supply node in response to a deselection signal being de-asserted;

an inverter circuit coupled between the supply node and a shifted ground node that provides a selectable reference voltage, the inverter circuit configured to receive as input a control signal from a control node and produce the deselection signal;

a current generator circuit configured to source a biasing current to the control node;

a memory control circuit configured to:

set a cascode control voltage to a negative value during a read operation of the memory device; and set the cascode control voltage to a positive value during a write operation of the memory device; and a second pull-down circuit coupled between the control node and the ground node, the second pull-down circuit configured to selectively couple the control node to the ground node in response to the at least one row selection signal being asserted, wherein the second pull-down circuit comprises a first cascode n-channel transistor, a cascode p-channel transistor having a control terminal configured to receive the cascode control voltage, a second cascode n-channel transistor, and at least one selection transistor all having conductive channels arranged in series between the control node and the ground node, and wherein the at least one selection transistor is controlled by the at least one row selection signal.

17. The row decoder circuit according to claim 16, wherein:

the first cascode n-channel transistor has a conductive channel arranged between the control node and a first cascode node;

the cascode p-channel transistor has a conductive channel arranged between the first cascode node and a second cascode node;

the second cascode n-channel transistor has a conductive channel arranged between the second cascode node and a third cascode node; and the at least one selection transistor has a conductive channel arranged between the third cascode node and the ground node.

18. The row decoder circuit according to claim 16, wherein the memory control circuit is further configured to:

during the read operation of the memory device, set the selectable supply voltage to a first supply value and set the selectable reference voltage to the ground voltage; and during the write operation of the memory device, set the selectable supply voltage to a second supply value that is higher than the first supply value, and set the selectable reference voltage to half of the second supply value.

19. The row decoder circuit according to claim 16, wherein:

the negative value of the cascode control voltage is equal to ground voltage minus a threshold voltage; and the positive value of the cascode control voltage is equal to half of the selectable supply voltage minus the threshold voltage.

20. The row decoder circuit according to claim 19, wherein the threshold voltage is in a range of 0.3 V to 0.5 V.

* * * * *